United States Patent
Lin et al.

(10) Patent No.: US 12,228,759 B2
(45) Date of Patent: Feb. 18, 2025

(54) HOUSING, MOBILE TERMINAL, AND SPUTTER COATING APPARATUS

(71) Applicant: Huawei Technologies Co., Ltd., Shenzhen (CN)

(72) Inventors: Peiling Lin, Shenzhen (CN); Ze Yuan, Shenzhen (CN); Guoping Wu, Shenzhen (CN); Xin Li, Shenzhen (CN); Meng Li, Shenzhen (CN); Xiaojun Dai, Shenzhen (CN); Jingjing Nie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1196 days.

(21) Appl. No.: 16/965,190

(22) PCT Filed: Aug. 6, 2018

(86) PCT No.: PCT/CN2018/099033
§ 371 (c)(1),
(2) Date: Jul. 27, 2020

(87) PCT Pub. No.: WO2019/144595
PCT Pub. Date: Aug. 1, 2019

(65) Prior Publication Data
US 2021/0072442 A1 Mar. 11, 2021

(30) Foreign Application Priority Data
Jan. 26, 2018 (CN) .......................... 201820142185.3

(51) Int. Cl.
*G02B 5/28* (2006.01)
*C23C 14/08* (2006.01)
(Continued)

(52) U.S. Cl.
CPC ............ *G02B 5/285* (2013.01); *C23C 14/083* (2013.01); *C23C 14/10* (2013.01);
(Continued)

(58) Field of Classification Search
CPC ... C23C 14/542; C23C 14/505; C23C 14/083; C23C 14/3464; C23C 14/0015;
(Continued)

(56) References Cited

U.S. PATENT DOCUMENTS

| 3,338,730 A | 8/1967 | Slade et al. |
| 9,794,382 B2 | 10/2017 | Yang et al. |

(Continued)

FOREIGN PATENT DOCUMENTS

| CN | 101608297 A | 12/2009 |
| CN | 101633287 A | 1/2010 |

(Continued)

OTHER PUBLICATIONS

Translation of JP07034293A. (Year: 1995).*
(Continued)

*Primary Examiner* — Catherine A. Simone
(74) *Attorney, Agent, or Firm* — Leydig, Voit & Mayer, Ltd.

(57) ABSTRACT

An enclosure of a mobile terminal and a sputter coating apparatus for making the same are provided. The enclosure includes a substrate and a composite film layer coated onto the substrate. The composite film layer has a thickness changing along a first direction. A difference in thickness between any two regions arranged along the first direction of the composite film layer is less than or equal to 350
(Continued)

nanometers. The enclosure has a spatially varying color corresponding to a wavelength between 400 nanometers and 760 nanometers.

20 Claims, 8 Drawing Sheets

(51) Int. Cl.
  *C23C 14/10* (2006.01)
  *C23C 14/34* (2006.01)
  *C23C 14/50* (2006.01)
  *C23C 14/54* (2006.01)
  *H01J 37/32* (2006.01)
  *H01J 37/34* (2006.01)
  *H04B 1/3827* (2015.01)

(52) U.S. Cl.
  CPC ........ *C23C 14/3464* (2013.01); *C23C 14/505* (2013.01); *C23C 14/542* (2013.01); *H01J 37/32633* (2013.01); *H01J 37/3417* (2013.01); *H04B 1/3827* (2013.01); *H01J 2237/332* (2013.01); *Y10T 428/24364* (2015.01); *Y10T 428/24479* (2015.01)

(58) Field of Classification Search
  CPC ................ G02B 5/285; H01J 37/32633; H01J 37/3417; H01J 2237/332; H04B 1/3827; H05K 5/0017; H05K 5/0217; H05K 5/0021
  See application file for complete search history.

(56) References Cited

U.S. PATENT DOCUMENTS

| | | |
|---|---|---|
| 2008/0145703 A1 | 6/2008 | Liu |
| 2014/0323185 A1 | 10/2014 | Lee et al. |
| 2017/0243850 A1 | 8/2017 | Bemmerl et al. |

FOREIGN PATENT DOCUMENTS

| | | | |
|---|---|---|---|
| CN | 102477533 A | | 5/2012 |
| CN | 102605326 A | | 7/2012 |
| CN | 103290379 A | | 9/2013 |
| CN | 203270024 U | | 11/2013 |
| CN | 103938168 A | | 7/2014 |
| CN | 104726831 A | | 6/2015 |
| CN | 106399926 A | | 2/2017 |
| CN | 106987820 A | | 7/2017 |
| CN | 107313020 A | | 11/2017 |
| CN | 206783753 U | | 12/2017 |
| CN | 206887218 U | | 1/2018 |
| JP | 07034293 A | * | 2/1995 |
| JP | 2017039621 A | | 2/2017 |

OTHER PUBLICATIONS

Kats et al., "Enhancement of absorption and color contrast in ultra-thin highly absorbing optical coatings," Applied Physics Letters 103, Oct. 11, 2004, Total 4 pages, XP012174779, AIP Publishing LLC (Published online Sep. 4, 2013).

* cited by examiner

HOUSING, MOBILE TERMINAL, AND SPUTTER COATING APPARATUS

This application is a national stage of International Application No. PCT/CN2018/099033, filed on Aug. 6, 2018, which claims priority to Chinese Patent Application No. 201820142185.3, filed on Jan. 26, 2018. Both of the aforementioned applications are hereby incorporated by reference in their entireties.

TECHNICAL FIELD

This application relates to the field of electronic devices, and in particular, to an enclosure, a mobile terminal, and a sputter coating apparatus.

BACKGROUND

Because of relatively great difficulty and a relatively low yield rate of multi-color coating technologies, currently, a rear cover of a mobile phone usually presents only one main color after conventional coating, that is, only a monotonous tone, resulting in a monotonous appearance of the mobile phone.

SUMMARY

Implementations of this application provide a gradient colored enclosure, a mobile terminal, and a sputter coating apparatus configured to manufacture the enclosure.

According to a first aspect, an implementation of this application provides an enclosure. The enclosure is applied to a mobile terminal. The enclosure includes a substrate and a composite film layer coated onto the substrate, and the composite film layer includes a plurality of film layers. A thickness of the composite film layer gradually decreases or increases along a first direction, and a difference between film thicknesses of any two regions arranged along the first direction on the composite film layer is less than or equal to 350 nanometers (nm), so that the enclosure presents a gradient color of a wavelength ranging from 400 nanometers to 760 nanometers.

In this implementation, because the thickness of the composite film layer of the enclosure gradually decreases or increases along the first direction, the enclosure can present the gradient color, thereby enriching and diversifying an appearance tone of the enclosure. In addition, because the difference between the film thicknesses of any two regions arranged along the first direction on the composite film layer is less than or equal to 350 nanometers, the enclosure can present a color of a wavelength ranging from 400 nanometers to 760 nanometers, that is, the enclosure can present rainbow colors such as red, orange, yellow, green, blue, indigo, and purple. Further, the presented rainbow colors are gradient, and therefore the appearance tone of the enclosure has more sensory appeal and can meet a color experience requirement of a customer.

The thickness of the composite film layer is greater than or equal to 50 nanometers but less than or equal to 400 nanometers, and the thickness of the composite film layer in the first direction changes along a flat curve, so that an appearance change of the enclosure is more natural and slower.

In an implementation, the thickness of the composite film layer gradually decreases or increases along a second direction, where the second direction intersects with the first direction. In other words, the thickness of the composite film layer gradually decreases or increases along a plurality of directions at the same time. Therefore, the enclosure can present a more flexible gradient color. In another implementation, the thickness of the composite film layer may alternatively gradually decrease or increase along a direction other than the first direction and the second direction.

In an implementation, an angle between the second direction and the first direction is less than or equal to 90°, and change trends of the thicknesses of the composite film layer in the first direction and the second direction are the same. That the change trends are the same means that both the thicknesses gradually increase or gradually decrease. When the substrate is approximately rectangular, the second direction is perpendicular to the first direction, the first direction is a long side direction of the substrate, and the second direction is a short side direction of the substrate.

In an implementation, the composite film layer includes first film layers and second film layers that are disposed in stacks, a refractive index of a coating material used for the first film layer is different from a refractive index of a coating material used for the second film layer, and change trends of thicknesses of the first film layer and the second film layer in a same direction are the same. In other words, the thicknesses of both the first film layer and the second film layer in the same direction gradually increase or gradually decrease.

A gradual increase or decrease degree of the thicknesses of both the first film layer and the second film layer in the same direction are roughly the same.

The coating material used for the first film layer and the coating material used for the second film layer may be a high-refractive-index coating material and a low-refractive-index coating material, so that a coating system formed by the two materials has better coating effects on a surface of the substrate, for example, reflecting light with a relatively long wavelength while keeping the composite film layer thin. Therefore, the enclosure meets a higher experience requirement (such as lighter and thinner, brighter and more colorful).

There are a plurality of first film layers, and there are a plurality of second film layers. The plurality of the first film layers and the plurality of the second film layers are alternately stacked one by one.

In an implementation, the first film layer is made of a titanium oxide material, the second film layer is made of a silicon oxide material, the composite film layer is located on an inner surface of the substrate, and the inner surface faces an inside of the mobile terminal. In this implementation, because the composite film layer is located on the inner surface of the substrate, an outer surface opposite to the inner surface of the substrate is highly flat, so that a user feels good when holding the mobile terminal in hand.

A film layer, of the composite film layer, that is closest to the substrate is the first film layer. The composite film layer includes two first film layers and two second film layers. The two first film layers and the two second film layers are alternately stacked one by one. Certainly, in another implementation, quantities of the first film layers and the second film layers may be another value.

In an implementation, the first film layer is made of a silicon nitride material, the second film layer is made of a silicon oxide material, the composite film layer is located on an outer surface of the substrate, and the outer surface faces an outside of the mobile terminal. In this implementation, because the first film layer is made of the silicon nitride material, abrasion resistance of the first film layer is relatively high, and abrasion resistance of the composite film layer is relatively high. Therefore, the composite film layer can be disposed on the outer surface of the substrate and has a relatively long life span.

A film layer, of the composite film layer, that is closest to the substrate is the first film layer. The composite film layer includes four first film layers and three second film layers. The four first film layers and the three second film layers are alternately stacked one by one. Certainly, in another implementation, quantities of the first film layers and the second film layers may be another value.

Certainly, in another implementation, other high-refractive-index target material and low-refractive-index target material may be alternatively used to implement coating effects. For example, the high-refractive-index target material may be titanium oxide ($TiO_2$), silicon nitride ($Si_3N_4$), zirconia, zinc oxide, or the like. The low-refractive-index target material may be silicon oxide ($SiO_2$), silicon fluoride, or the like.

In an implementation, the composite film layer includes a first region, a second region, and a third region that are of a same area, the first region, the second region, and the third region are sequentially arranged at equal intervals in the first direction, a difference between an average film thickness of the first region and an average film thickness of the second region is a first value, a difference between the average film thickness of the second region and an average film thickness of the third region is a second value, and a ratio of the first value to the second value is within a range of 0.5 to 2.0.

In this implementation, the first region, the second region, and the third region are sequentially arranged in the first direction, and therefore the first region, the second region, and the third region can present the gradient color. The ratio of the first value to the second value is within the range of 0.5 to 2.0, that is, the first value is close to or the same as the second value, and the first region, the second region, and the third region have a same area. Therefore, the equally spaced first region, the second region, and the third region can present a gradient color of adjacent colors, and each adjacent color has a relatively large presentation area, that is, each adjacent color can be relatively fully presented on the enclosure. This can avoid sensory discomfort caused by a sudden color change in adjacent regions when a presentation area of a color is too small, thereby improving an appearance texture of the enclosure and improving user experience.

When the ratio of the first value to the second value is within a range of 0.8 to 1.2, the color of the enclosure changes more slowly, and user experience is better.

In an implementation, the substrate is made of one or more of a glass material, polycarbonate (Polycarbonate, PC), polyethylene terephthalate (polyethylene terephthalate, PET), metal, and a ceramic material.

In an implementation, the gradient color includes adjacent colors: purple, blue, and cyan. A wavelength of the cyan color ranges from 492 nanometers to 480 nanometers. A wavelength of the blue color ranges from 480 nanometers to 455 nanometers. A wavelength of the purple color ranges from 455 nanometers to 350 nanometers.

According to a second aspect, an implementation of this application further provides a mobile terminal. The mobile terminal includes an enclosure. The mobile terminal may be any device with communication and storage functions, for example, a network-enabled smart device such as a tablet computer, a mobile phone, an e-reader, a remote control, a personal computer (Personal Computer, PC), a notebook computer, an in-vehicle device, a network television, or a wearable device.

According to a third aspect, an implementation of this application further provides a sputter coating apparatus. The sputter coating apparatus may be configured to manufacture the enclosure according to any one of the foregoing implementations. The sputter coating apparatus includes a coating chamber, a base, a plurality of target materials, and a plurality of baffle plates. The base is disposed inside the coating chamber. A bearing surface configured to fasten a substrate is provided on an outside of the base, and the bearing surface is disposed opposite to and spaced from an inner wall of the coating chamber, so that a coating space is formed between the bearing surface and the inner wall. The plurality of target materials are accommodated in the coating space and fastened to the inner wall at intervals. The plurality of baffle plates are accommodated in the coating space and disposed facing the plurality of target materials in a one-to-one correspondence. The plurality of baffle plates also face the bearing surface.

Each of the baffle plates includes at least one block unit. The block unit includes at least two bar-shaped flaps arranged in a third direction, the at least two bar-shaped flaps extend along a fourth direction perpendicular to the third direction, and lengths of the at least two bar-shaped flaps in the fourth direction gradually increase or decrease along the third direction, to unevenly block the plurality of target materials, so that the composite film layer whose thickness gradually decreases or increases is formed on the substrate.

In this implementation, the baffle plates exactly face the plurality of target materials to block the plurality of target materials, a longer bar-shaped flap of the block unit of the baffle plate has a larger block area, a shorter bar-shaped flap has a smaller block area, and the lengths of the at least two bar-shaped flaps of the block unit gradually increase or decrease. Therefore, the block unit can unevenly block the plurality of target materials, so that quantities of target material atoms that escape from the plurality of target materials and move to the substrate are not even, the plurality of target materials can form, on the substrate, the composite film layer whose thickness gradually decreases or increases, and the enclosure can present a gradient color.

The lengths of the at least two bar-shaped flaps in the fourth direction (which is a direction to which the bar-shaped flaps extend) gradually increase or decrease along the third direction (which is a direction in which the at least two bar-shaped flaps are arranged). Therefore, the thickness of the composite film layer formed on the substrate gradually decreases or increases in the third direction. When the substrate is fastened to the bearing surface, a direction on the substrate that is the same as the third direction is the first direction. It can be understood that in a coating process, a gradual length increase or decrease of the at least two bar-shaped flaps also affects a thickness change of the composite film layer in another direction, for example, the second direction. The thickness of the composite film layer in the second direction gradually decreases or increases, where an angle between the second direction and the first direction is less than or equal to 90°.

In an implementation, the bearing surface is a cylindrical surface, and the bearing surface has at least one fastening region arranged in a circumferential direction of the bearing surface. The sputter coating apparatus further includes a driving piece, and the driving piece is configured to drive the base to rotate at a preset rotation speed, so that the bearing surface carries the substrate to rotate around an axis of the bearing surface.

In this implementation, more fastening regions may be arranged, so that the bearing surface can bear more substrates. When the driving piece drives the base to rotate, target material atoms sputtered by the plurality of target materials are sequentially coated onto substrates in different fastening regions, thereby implementing batch coating. When the driving piece controls the base to rotate at the preset rotation speed, both coating time and coating thicknesses of a plurality of substrates fastened onto the bearing surface can be reliably controlled, thereby increasing a yield rate of the enclosure.

In an implementation, each of the fastening region includes a plurality of fastening areas arranged in an axial direction of the bearing surface, one fastening area is configured to fasten one substrate, the block units of the baffle plates are arranged in the axial direction of the bearing surface, and a quantity of block units of one baffle plate is the same as a quantity of fastening areas of one fastening region.

In this implementation, each fastening region includes the plurality of fastening areas to simultaneously fasten the plurality of substrates. The baffle plates include a plurality of block units corresponding to a plurality of substrates, and therefore the plurality of substrates can be simultaneously coated, so that the sputter coating apparatus can manufacture the enclosure in larger scale.

In an implementation, the plurality of target materials are fastened to the inner wall in the circumferential direction of the bearing surface at equal intervals. In this case, the plurality of target materials can simultaneously sputter target material atoms, and the target material atoms move to different substrates to form a corresponding film layer. This improves processing efficiency of the substrates. In addition, the plurality of target materials are disposed at intervals. This can also avoid mutual interference, so that the yield rate of the enclosure is relatively high. Because the plurality of baffle plates are of the same structure, gradual change trends of different film layers formed by the plurality of target materials on the substrates are approximately the same. This further ensures quality of the composite film layer.

In an implementation, the plurality of target materials include a first target material and a second target material, and a refractive index of the first target material is different from that of the second target material. Because the plurality of baffle plates are of the same structure, a thickness change trend of the first film layer formed by the first target material on the substrate is the same as a thickness change trend of the different second film layer formed by the second target material on the substrate.

Materials used for the first target material and the second target material may be a high-refractive-index coating material and a low-refractive-index coating material, so that a coating system formed by the two materials has better coating effects on a surface of the substrate, for example, reflecting light with a relatively long wavelength while keeping the composite film layer thin. Therefore, the enclosure meets a higher experience requirement. For example, the first target material is made of a titanium oxide material, and the second target material is made of a silicon oxide material. Alternatively, the first target material is made of a silicon nitride material, and the second target material is made of a silicon oxide material. Certainly, in another implementation, other high-refractive-index target material and low-refractive-index target material may be alternatively used to implement coating effects. For example, the high-refractive-index target material may be titanium oxide ($TiO_2$), silicon nitride ($Si_3N_4$), zirconia, zinc oxide, or the like. The low-refractive-index target material may be silicon oxide ($SiO_2$), silicon fluoride, or the like.

A quantity of first film layers formed by the first target material and a quantity of second film layers formed by the second target material may be controlled by revolutions of the bearing surface.

In an implementation, same ends of at least two bar-shaped flaps of a same block unit are aligned with each other. In this case, the other ends of the at least two bar-shaped flaps protrude in sequence, and block effects of the baffle plate is relatively controllable. The baffle plate further includes a bracing piece, the aligned ends of the at least two bar-shaped flaps of the baffle plate are fastened to the bracing piece. The bracing piece is fastened to the coating chamber.

In an implementation, the at least two bar-shaped flaps include a first flap, a second flap, and a third flap that are arranged in sequence, a difference between lengths of the third flap and the second flap in the fourth direction is a first difference, a difference between lengths of the second flap and the first flap in the fourth direction is a second difference, and a ratio of the second difference to the first difference is within a range of 0.5 to 2.0.

In this implementation, the ratio of the second difference to the first difference is within the range of 0.5 to 2.0, that is, the second difference is close to or the same as the first difference. Therefore, change trends of lengths of the at least two bar-shaped flaps are flat, and film thicknesses of the composite film layer in different regions change slowly, so that each of adjacent colors can be relatively fully presented. This can avoid sensory discomfort caused by a sudden color change in adjacent regions when a presentation area of a color is too small, thereby improving an appearance texture of the enclosure and improving user experience.

When the ratio of the second difference to the first difference is within a range of 0.8 to 1.2, the film thicknesses of the composite film layer in the different regions change more slowly, the color of the enclosure changes more slowly, and user experience is better.

DESCRIPTION OF EMBODIMENTS

The following describes implementations of this application with reference to the accompanying drawings in the implementations of this application.

Figure 1:
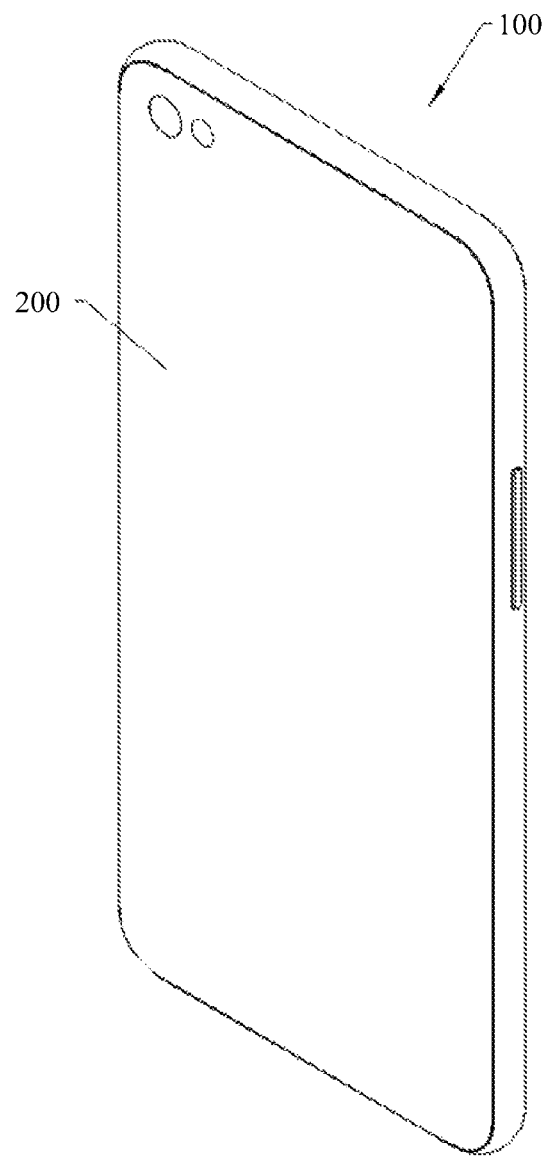
FIG. 1 is a schematic structural diagram of a mobile terminal according to an implementation of this application.

Referring to FIG. 1, an implementation of this application provides a mobile terminal 100. The mobile terminal 100 may be any device with communication and storage functions, for example, a network-enabled smart device such as a tablet computer, a mobile phone, an e-reader, a remote control, a personal computer (Personal Computer, PC), a notebook computer, an in-vehicle device, a network television, or a wearable device.

Figure 2:
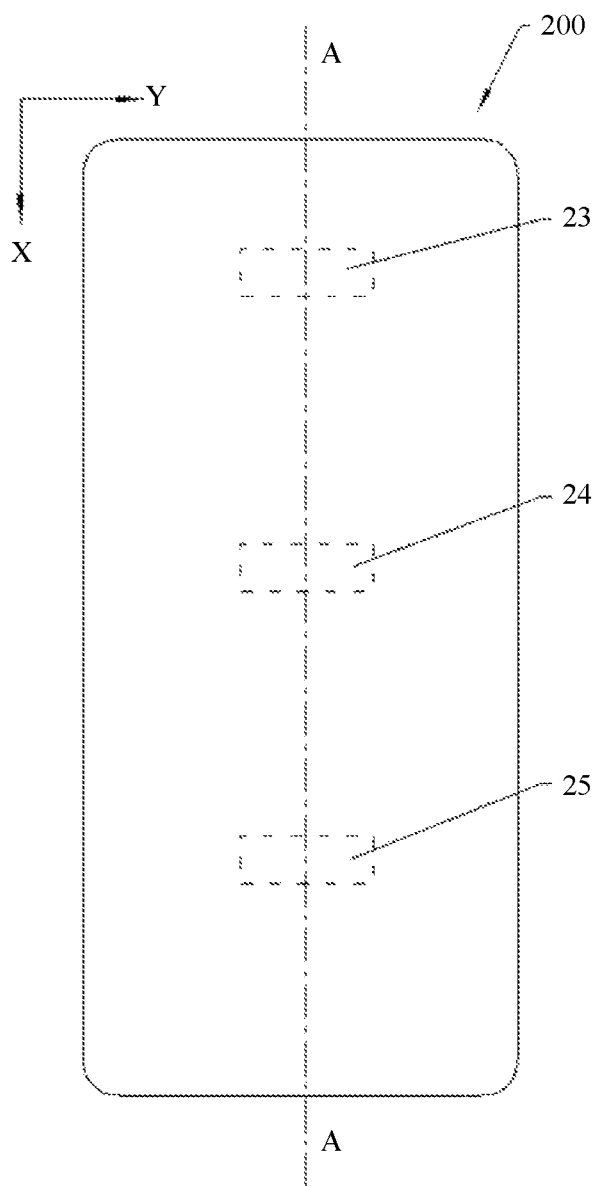
FIG. 2 is a schematic diagram of an enclosure of the mobile terminal in FIG. 1.
Figure 3:
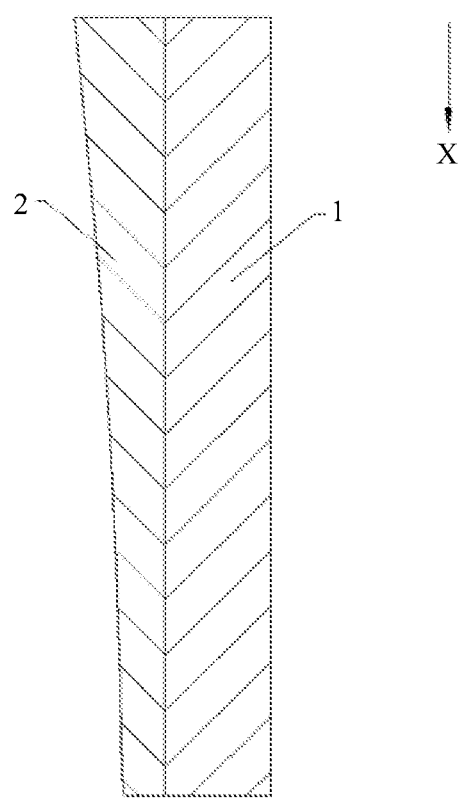
FIG. 3 is a schematic structural diagram of the enclosure in FIG. 2 along an A-A line.

Referring to FIG. 1 to FIG. 3, the mobile terminal 100 includes an enclosure 200. The enclosure 200 includes a substrate 1 and a composite film layer 2 coated onto the substrate 1, and the composite film layer 2 includes a plurality of film layers. A thickness of the composite film layer 2 gradually decreases or increases along a first direction X, and a difference between film thicknesses of any two regions arranged along the first direction X on the composite film layer 2 is less than or equal to 350 nanometers (nm), so that the enclosure 200 presents a gradient color of a wavelength ranging from 400 nanometers to 760 nanometers. The enclosure 200 may be a rear cover of the mobile terminal 100. The enclosure 200 may further include a middle frame of the mobile terminal 100.

In this implementation, because the thickness of the composite film layer 2 of the enclosure 200 gradually decreases or increases along the first direction X, the enclosure 200 can present the gradient color, thereby enriching and diversifying an appearance tone of the enclosure 200. In addition, because the difference between the film thicknesses of any two regions arranged along the first direction X on the composite film layer 2 is less than or equal to 350 nanometers, the enclosure 200 can present a color of a wavelength ranging from 400 nanometers to 760 nanometers, that is, the enclosure 200 can present rainbow colors such as red, orange, yellow, green, blue, indigo, and purple. Further, the presented rainbow colors are gradient, and therefore the appearance tone of the enclosure 200 has more sensory appeal and can meet a color experience requirement of a customer.

It can be understood that on the composite film layer 2, a multi-layer nano-film optical interference principle is used to display a plurality of colors. In this application, the direction X in the figure is an example of the first direction in this application, and does not constitute any limitation on the first direction. In another implementation, the first direction may alternatively be another direction, for example, a direction opposite to the direction X. Gradual increase or decrease in this application includes but is not limited to gradual increase or decrease along a curve.

The thickness of the composite film layer 2 is greater than or equal to 50 nanometers but less than or equal to 400 nanometers. The thickness of the composite film layer 2 in the first direction X changes along a flat curve, so that an appearance change of the enclosure 200 is more natural and slower. The difference between the film thicknesses of the any two regions is a difference between film thicknesses at center points of the any two regions.

A wavelength of the red color ranges from 770 nanometers to 622 nanometers. A wavelength of the orange color ranges from 622 nanometers to 597 nanometers. A wavelength of the yellow color ranges from 597 nanometers to 577 nanometers. A wavelength of the green color ranges from 577 nanometers to 492 nanometers. A wavelength of the cyan (indigo) color ranges from 492 nanometers to 480 nanometers. A wavelength of the blue color ranges from 480 nanometers to 455 nanometers. A wavelength of the purple color ranges from 455 nanometers to 350 nanometers.

In an implementation, the thickness of the composite film layer 2 gradually decreases or increases along a second direction Y, and the second direction Y intersects with the first direction X. In other words, the thickness of the composite film layer 2 gradually decreases or increases along a plurality of directions at the same time. Therefore, the enclosure 200 can present a more flexible gradient color. In another implementation, the thickness of the composite film layer 2 may alternatively gradually decrease or increase along a direction other than the first direction X and the second direction Y.

An angle between the first direction X and the second direction Y is less than or equal to 90°, and change trends of the thicknesses of the composite film layer 2 in the first direction X and the second direction Y are the same. That the change trends are the same means that both the thicknesses gradually increase or gradually decrease. When the substrate 1 is approximately rectangular, the second direction Y is perpendicular to the first direction X, the first direction X is a long side direction of the substrate 1, and the second direction Y is a short side direction of the substrate 1.

In this application, the direction Y in the figure is an example of the second direction in this application, and does not constitute any limitation on the second direction. In another implementation, the second direction may alternatively be another direction, for example, a direction opposite to the direction Y.

Figure 4:
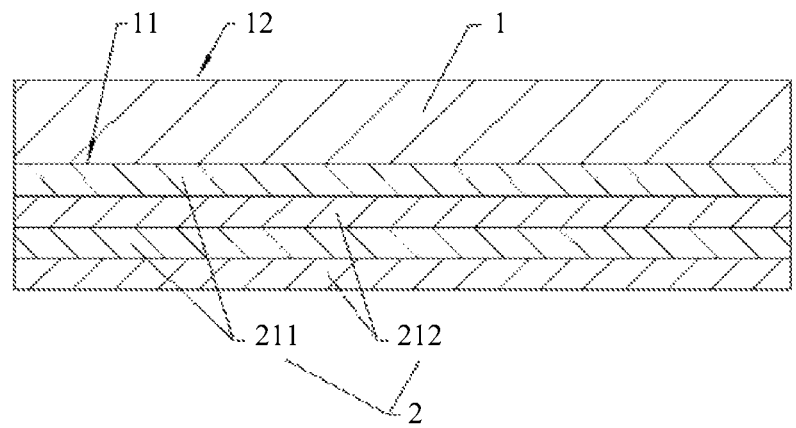
FIG. 4 is a schematic structural diagram of an implementation of the enclosure in FIG. 2.
Figure 5:
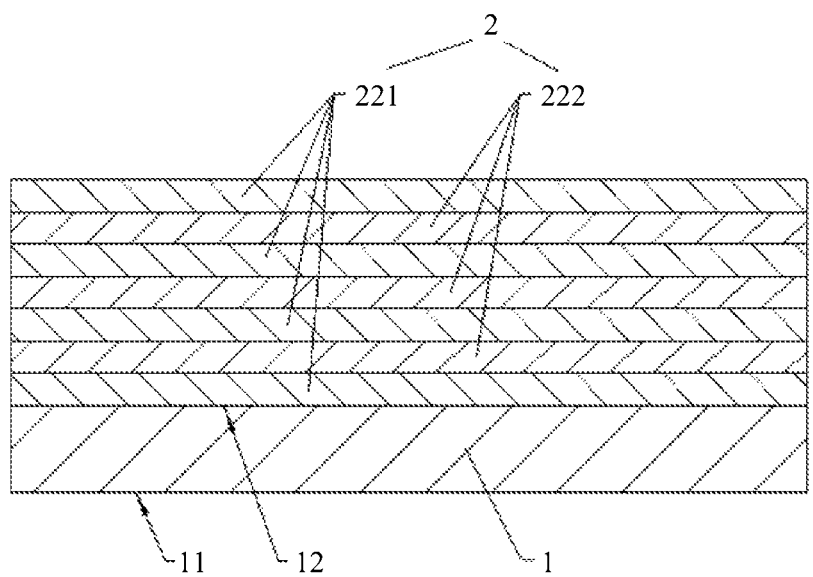
FIG. 5 is a schematic structural diagram of another implementation of the enclosure in FIG. 2.

In an implementation, referring to FIG. 4 and FIG. 5, the composite film layer 2 includes first film layers (211/221) and second film layers (212/222) that are disposed in stacks, a refractive index of a coating material used for the first film layer (211/221) is different from a refractive index of a coating material used for the second film layer (212/222), and change trends of thicknesses of the first film layer (211/221) and the second film layer (212/222) in a same direction are the same. In other words, the thicknesses of both the first film layer (211/221) and the second film layer (212/222) in the same direction gradually increase or gradually decrease.

A gradual increase or decrease degree of the thicknesses of both the first film layer (211/221) and the second film layer (212/222) in the same direction are roughly the same.

The coating material used for the first film layer (211/221) and the coating material used for the second film layer (212/222) may be a high-refractive-index coating material and a low-refractive-index coating material, so that a coating system formed by the two materials has better coating effects on a surface of the substrate 1, for example, reflecting light with a relatively long wavelength while keeping the composite film layer 2 thin. Therefore, the enclosure 200 meets a higher experience requirement (such as lighter and thinner, brighter and more colorful).

There are a plurality of first film layers (211/221), and there are a plurality of second film layers (212/222). The plurality of the first film layers (211/221) and the plurality of the second film layers (212/222) are alternately stacked one by one.

In an implementation, as shown in FIG. 4, the first film layer 211 is made of a titanium oxide material, the second film layer 212 is made of a silicon oxide material, the composite film layer 2 is located on an inner surface 11 of the substrate 1, and the inner surface 11 faces an inside of the mobile terminal 100. In this implementation, because the composite film layer 2 is located on the inner surface 11 of the substrate 1, an outer surface 12 opposite to the inner surface 11 of the substrate 1 is highly flat, so that a user feels good when holding the mobile terminal 100 in hand.

A film layer, of the composite film layer 2, that is closest to the substrate 1 is the first film layer 211. The composite film layer 2 includes two first film layers 211 and two second film layers 212. The two first film layers 211 and the two second film layers 212 are alternately stacked one by one. Certainly, in another implementation, quantities of the first film layers 211 and the second film layers 212 may be another value.

In an implementation, as shown in FIG. 5, the first film layer 221 is made of a silicon nitride material, the second film layer 222 is made of a silicon oxide material, the composite film layer 2 is located on an outer surface 12 of the substrate 1, and the outer surface 12 faces an outside of the mobile terminal 100. In this implementation, because the first film layer 221 is made of the silicon nitride material, abrasion resistance of the first film layer 221 is relatively high, and abrasion resistance of the composite film layer 2 is relatively high. Therefore, the composite film layer 2 can be disposed on the outer surface 12 of the substrate 1 and has a relatively long life span.

A film layer, of the composite film layer 2, that is closest to the substrate 1 is the first film layer 221. The composite film layer 2 includes four first film layers 221 and three second film layers 222. The four first film layers 221 and the three second film layers 222 are alternately stacked one by one. Certainly, in another implementation, quantities of the first film layers 221 and the second film layers 222 may be another value.

Certainly, in another implementation, other high-refractive-index target material and low-refractive-index target material may be alternatively used to implement coating effects. For example, the high-refractive-index target material may be titanium oxide ($TiO_2$), silicon nitride ($Si_3N_4$), zirconia, zinc oxide, or the like. The low-refractive-index target material may be silicon oxide ($SiO_2$), silicon fluoride, or the like.

In an implementation, the composite film layer 2 includes three to 10 film layers.

In an implementation, as shown in FIG. 2, the composite film layer 2 includes a first region 23, a second region 24, and a third region 25 that are of a same area, the first region 23, the second region 24, and the third region 25 are sequentially arranged at equal intervals in the first direction X, a difference between an average film thickness of the first region 23 and an average film thickness of the second region 24 is a first value, a difference between the average film thickness of the second region 24 and an average film thickness of the third region 25 is a second value, and a ratio of the first value to the second value is within a range of 0.5 to 2.0.

In this implementation, the first region 23, the second region 24, and the third region 25 are sequentially arranged in the first direction X, and therefore the first region 23, the second region 24, and the third region 25 can present the gradient color. The ratio of the first value to the second value is within the range of 0.5 to 2.0, that is, the first value is close to or the same as the second value, and the first region 23, the second region 24, and the third region 25 have a same area. Therefore, the equally spaced first region 23, the second region 24, and the third region 25 can present a gradient color of adjacent colors, and each adjacent color has a relatively large presentation area, that is, each adjacent color can be relatively fully presented on the enclosure 200. This can avoid sensory discomfort caused by a sudden color change in adjacent regions when a presentation area of a color is too small, thereby improving an appearance texture of the enclosure 200 and improving user experience.

It can be understood that the "average film thickness" is an average value of film thicknesses of points (which include at least five points used as sample points) of a corresponding region. Therefore, the average film thickness of the region can basically reflect a color of the corresponding region. In another implementation, the first region 23, the second region 24, and the third region 25 may be alternatively arranged along the second direction Y or another direction.

When the ratio of the first value to the second value is within a range of 0.8 to 1.2, the color of the enclosure changes more slowly, and user experience is better.

Certainly, in another implementation, the enclosure 200 may alternatively present a color with a relatively large transition fluctuation, so that appearance of the enclosure 200 has strong visual impact.

In an implementation, the substrate 1 is made of one or more of a glass material, polycarbonate (Polycarbonate, PC), polyethylene terephthalate (polyethylene terephthalate, PET), metal, and a ceramic material.

In an implementation, the gradient color includes adjacent colors: purple, blue, and cyan. A wavelength of the cyan color ranges from 492 nanometers to 480 nanometers. A wavelength of the blue color ranges from 480 nanometers to 455 nanometers. A wavelength of the purple color ranges from 455 nanometers to 350 nanometers.

Figure 6:
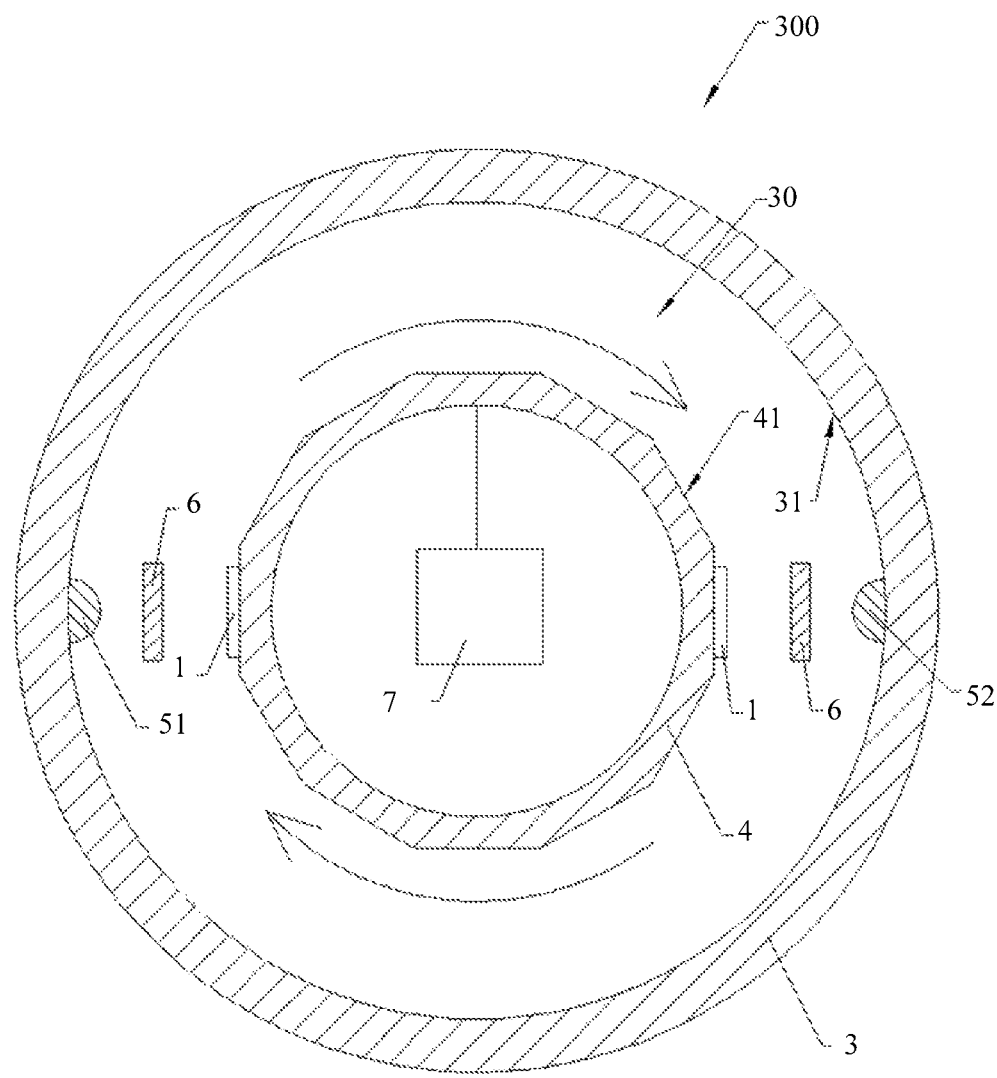
FIG. 6 is a schematic structural diagram of a sputter coating apparatus according to an implementation of this application.
Figure 7:
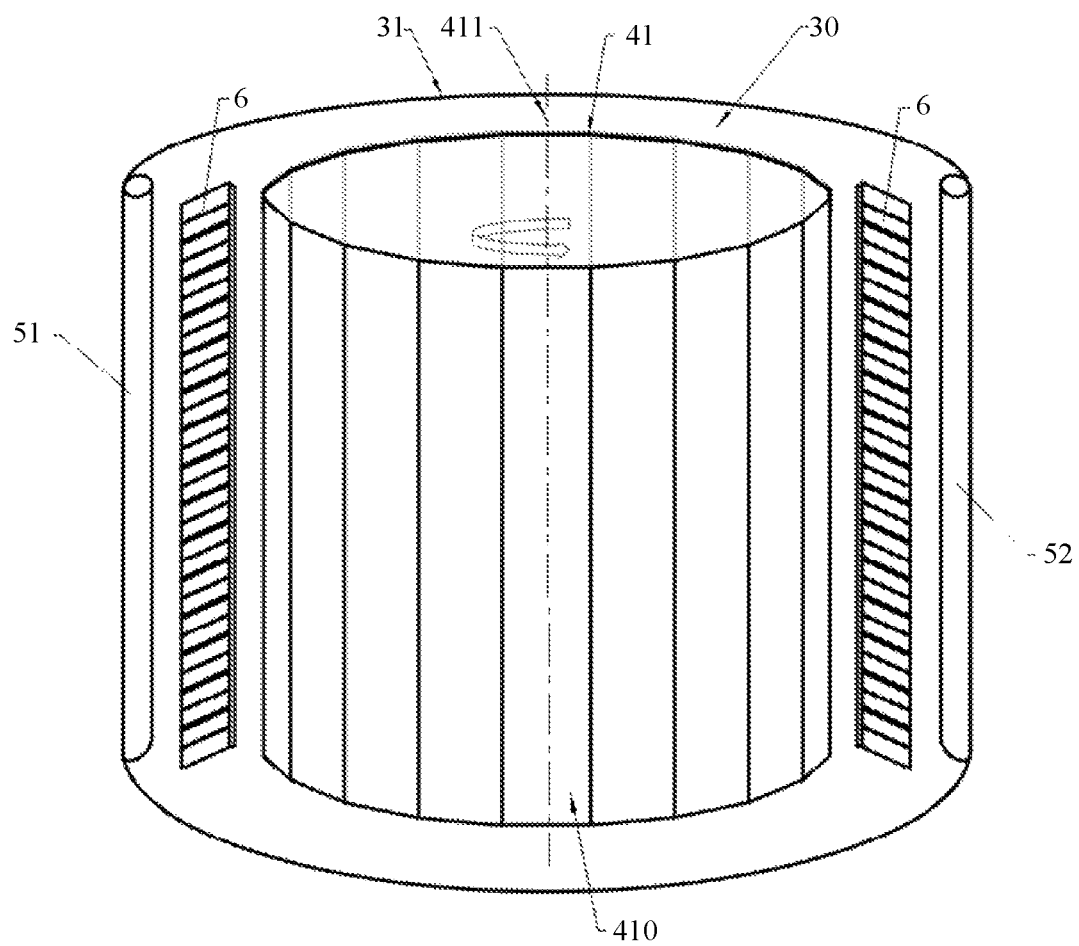
FIG. 7 is a schematic structural diagram of the sputter coating apparatus in FIG. 6 from another angle.
Figure 8:
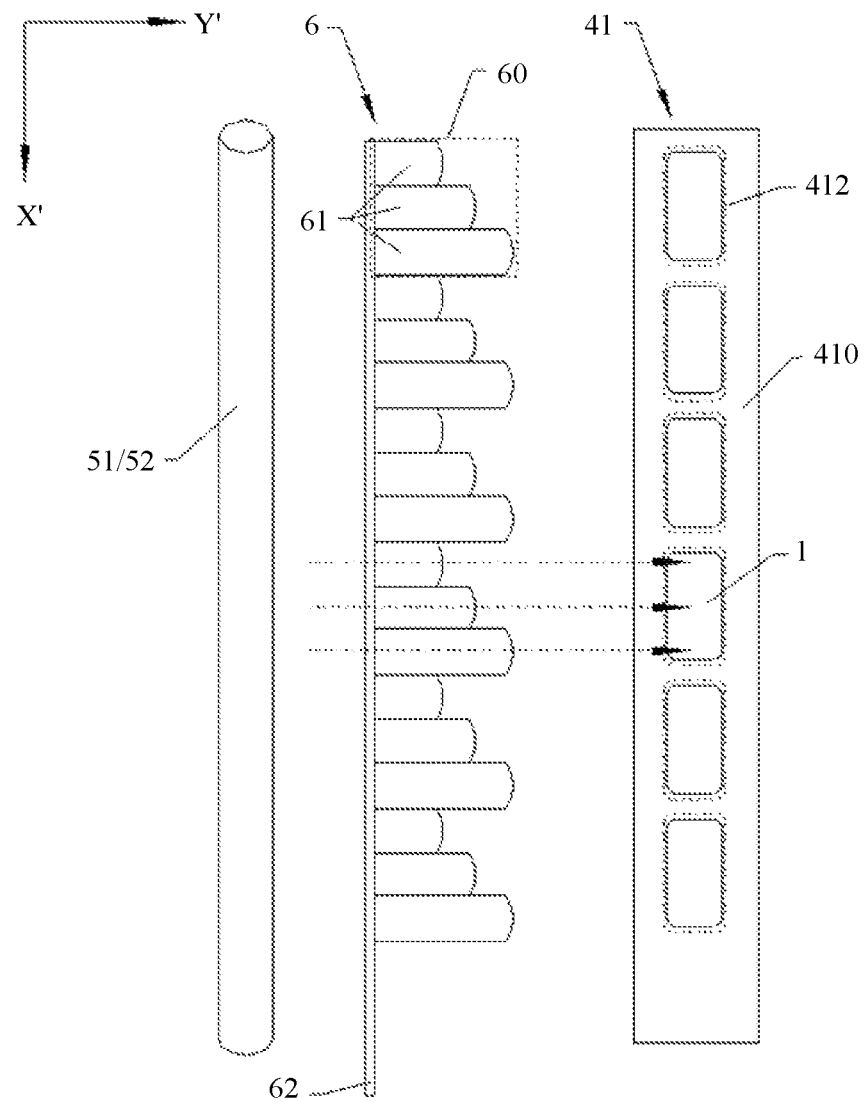
FIG. 8 is a schematic structural diagram of a part of the sputter coating apparatus in FIG. 6.

Referring to FIG. 6 to FIG. 8, an implementation of this application further provides a sputter coating apparatus 300. The sputter coating apparatus 300 may be configured to manufacture the enclosure 200 according to any one of the foregoing implementations. The sputter coating apparatus 300 includes a coating chamber 3, a base 4, a plurality of target materials (51/52), and a plurality of baffle plates 6. The base 4 is disposed inside the coating chamber 3. A bearing surface 41 configured to fasten a substrate 1 is provided on an outside of the base 4, and the bearing surface 41 is disposed opposite to and spaced from an inner wall 31 of the coating chamber 3, so that a coating space 30 is formed between the bearing surface 41 and the inner wall 31. The plurality of target materials (51/52) are accommodated in the coating space 30 and fastened to the inner wall 31 at intervals. The plurality of baffle plates 6 are accommodated in the coating space 30 and disposed facing the plurality of target materials (51/52) in a one-to-one correspondence. The plurality of baffle plates 6 also face the bearing surface 41.

Each of the baffle plates 6 includes at least one block unit 60. The block unit 60 includes at least two bar-shaped flaps 61 arranged in a third direction X', the at least two bar-shaped flaps 61 extend along a fourth direction Y' perpendicular to the third direction X', and lengths of the at least two bar-shaped flaps 61 in the fourth direction Y' gradually increase or decrease along the third direction X', to unevenly block the plurality of target materials (51/52), so that the composite film layer 2 whose thickness gradually decreases or increases is formed on the substrate 1.

As shown by a dashed-line arrow in FIG. 8, the sputter coating apparatus 300 hits surfaces of the plurality of target materials (51/52) by using charged particles in a vacuum, so that target material atoms on the surfaces of the plurality of target materials (51/52) escape from original crystal lattices, and then move across the baffle plate 6 to the surface of the substrate 1 to form the composite film layer 2. A coating principle of the sputter coating apparatus 300 is one of NCVM (Non-Conductive Vacuum Metallization, non-conductive vacuum metallization) coating technologies.

In this implementation, the baffle plates 6 exactly face the plurality of target materials (51/52) to block the plurality of target materials (51/52), a longer bar-shaped flap 61 of the block unit 60 of the baffle plate 6 has a larger block area, a shorter bar-shaped flap 61 has a smaller block area, and the lengths of the at least two bar-shaped flaps 61 of the block unit 60 gradually increase or decrease. Therefore, the block unit 60 can unevenly block the plurality of target materials (51/52), so that quantities of target material atoms that escape from the plurality of target materials (51/52) and move to the substrate 1 are not even, the plurality of target materials (51/52) can form, on the substrate 1, the composite film layer 2 whose thickness gradually decreases or increases, and the enclosure 200 can present a gradient color.

The lengths of the at least two bar-shaped flaps 61 in the fourth direction Y' (which is a direction to which the bar-shaped flaps 61 extend) gradually increase or decrease along the third direction X' (which is a direction in which the at least two bar-shaped flaps 61 are arranged). Therefore, the thickness of the composite film layer 2 formed on the substrate 1 gradually decreases or increases in the third direction X'. For example, when the lengths of the at least two bar-shaped flaps 61 in the fourth direction Y' gradually increase along the third direction X', the thickness of the composite film layer 2 formed on the substrate 1 gradually decreases along the third direction X'. When the substrate 1 is fastened to the bearing surface 41, a direction on the substrate 1 that is the same as the third direction X' is the first direction X. It can be understood that in a coating process, a gradual length increase or decrease of the at least two bar-shaped flaps 61 also affects a thickness change of the composite film layer 2 in another direction, for example, the second direction Y. The thickness of the composite film layer 2 in the second direction Y gradually decreases or increases, where an angle between the second direction Y and the first direction X is less than or equal to 90°.

The baffle plate 6 may be made of a stainless steel, tin foil, or aluminum material. For example, the baffle plate 6 may be a thin stainless steel sheet, a foil, or an aluminum sheet. In this case, the baffle plate 6 is easy to cut and modify, so that a shape of the baffle plate 6 can better meet a requirement of uneven blockage. In other words, the at least two bar-shaped flaps 61 are integrally formed. The at least two bar-shaped flaps 61 may be obtained by cutting a same sheet of material. Certainly, in another implementation, the baffle plate 6 may alternatively be of an integral structure obtained through combination.

Certainly, in another implementation, a direction on the substrate 1 that is the same as the third direction X' may alternatively be the second direction Y.

In an implementation, as shown in FIG. 6 and FIG. 7, the bearing surface 41 is a cylindrical surface, and the bearing surface 41 has at least one fastening region 410 arranged in a circumferential direction (this direction is perpendicular to an axis 411 of the bearing surface 41) of the bearing surface 41. The sputter coating apparatus 300 further includes a driving piece 7, and the driving piece 7 is configured to drive the base 4 to rotate at a preset rotation speed, so that the bearing surface 41 carries the substrate 1 to rotate around the axis 411 of the bearing surface 41.

In this implementation, more fastening regions 410 may be arranged, so that the bearing surface 41 can bear more substrates 1. When the driving piece 7 drives the base 4 to rotate, target material atoms sputtered by the plurality of target materials (51/52) are sequentially coated onto substrates 1 in different fastening regions 410, thereby implementing batch coating. When the driving piece 7 controls the base 4 to rotate at the preset rotation speed, both coating time and coating thicknesses of a plurality of substrates 1 fastened onto the bearing surface 41 can be reliably controlled, thereby increasing a yield rate of the enclosure 200.

The preset rotation speed may include a uniform speed section and a variable speed section. In the uniform speed section, thicknesses of films coated by using the target material atoms of the plurality of target materials (51/52) onto the plurality of the substrates 1 are relatively even. In the variable speed section, the target material atoms of the plurality of target materials (51/52) may be unevenly coated onto the substrates 1, so that the thickness of the composite film layer 2 on the substrate 1 changes gradually. For example, when the substrate 1 is fastened to the bearing surface 41, the second direction Y on the substrate 1 is the same as the circumferential direction of the bearing surface 41. When the rotation speed of the bearing surface 41 increases, the thickness of the composite film layer 2 in the second direction Y can significantly decrease.

A quantity of the fastening regions 410 may be greater than or equal to 2. A shape of the bearing surface 41 on a plane perpendicular to the axis 411 of the bearing surface 41 is a polygon. The fastening regions 410 are on a same side of the polygon.

In an implementation, referring to FIG. 6 to FIG. 8, all the fastening regions 410 include a plurality of fastening areas 412 arranged in the axial direction (this direction is parallel to the axis 411 of the bearing surface 41) of the bearing surface 41. One fastening area 412 is configured to fasten one substrate 1. The block units 60 of the baffle plates 6 are arranged in the axial direction of the bearing surface 41. A quantity of block units 60 of one baffle plate 6 is the same as a quantity of fastening areas 412 of one fastening region 410.

In this implementation, each fastening region 410 includes the plurality of fastening areas 412 to simultaneously fasten the plurality of substrates 1. The baffle plates 6 include a plurality of block units 60 corresponding to a plurality of substrates 1, and therefore the plurality of substrates 1 can be simultaneously coated, so that the sputter coating apparatus 300 can manufacture the enclosure 200 in larger scale.

In an implementation, as shown in FIG. 6 and FIG. 7, the plurality of target materials (51/52) are fastened to the inner wall 31 in the circumferential direction of the bearing surface 41 at equal intervals. In this case, the plurality of target materials (51/52) can simultaneously sputter target material atoms, and the target material atoms move to different substrates 1 to form a corresponding film layer. This improves processing efficiency of the substrates 1. In addition, the plurality of target materials (51/52) are disposed at intervals. This can also avoid mutual interference, so that the yield rate of the enclosure 200 is relatively high. Because the plurality of baffle plates 6 are of the same structure, gradual change trends of different film layers formed by the plurality of target materials (51/52) on the substrates 1 are approximately the same. This further ensures quality of the composite film layer 2.

In an implementation, the plurality of target materials (51/52) include a first target material 51 and a second target material 52, and a refractive index of the first target material 51 is different from that of the second target material 52. Because the plurality of baffle plates 6 are of the same structure, a thickness change trend of the first film layer (211/221) formed by the first target material 51 on the substrate 1 is the same as a thickness change trend of the different second film layer (212/222) formed by the second target material 52 on the substrate 1.

Materials used for the first target material 51 and the second target material 52 may be a high-refractive-index coating material and a low-refractive-index coating material, so that a coating system formed by the two materials has better coating effects on a surface of the substrate 1, for example, reflecting light with a relatively long wavelength while keeping the composite film layer 2 thin. Therefore, the enclosure 200 meets a higher experience requirement. For example, the first target material 51 is made of a titanium oxide material, and the second target material 52 is made of a silicon oxide material. Alternatively, the first target material 51 is made of a silicon nitride material, and the second target material 52 is made of a silicon oxide material. Certainly, in another implementation, other high-refractive-index target material and low-refractive-index target material may be alternatively used to implement coating effects. For example, the high-refractive-index target material may be titanium oxide ($TiO_2$), silicon nitride ($Si_3N_4$), zirconia, zinc oxide, or the like. The low-refractive-index target material may be silicon oxide ($SiO_2$), silicon fluoride, or the like.

A quantity of first film layers (211/221) formed by the first target material 51 and a quantity of second film layers (212/222) formed by the second target material 52 may be controlled by revolutions of the bearing surface 41.

In an implementation, as shown in FIG. 8, same ends of at least two bar-shaped flaps 61 of a same block unit 60 are aligned with each other. In this case, the other ends of the at least two bar-shaped flaps 61 protrude in sequence, and block effects of the baffle plate 6 is relatively controllable. The baffle plate 6 further includes a bracing piece 62, the aligned ends of the at least two bar-shaped flaps 61 of the baffle plate 6 are fastened to the bracing piece 62. The bracing piece 62 is fastened to the coating chamber 3.

Figure 9:
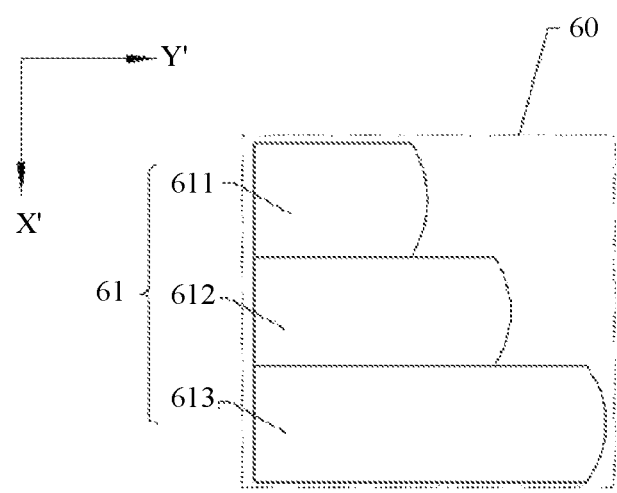
FIG. 9 is a schematic structural diagram of a block unit of a baffle plate of the sputter coating apparatus in FIG. 6.

In an implementation, referring to FIG. 8 and FIG. 9, the at least two bar-shaped flaps 61 include a first flap 611, a second flap 612, and a third flap 613 that are arranged in sequence, a difference between lengths of the third flap 613 and the second flap 612 in the fourth direction Y' is a first difference, a difference between lengths of the second flap 612 and the first flap 611 in the fourth direction Y' is a second difference, and a ratio of the second difference to the first difference is within a range of 0.5 to 2.0.

In this implementation, the ratio of the second difference to the first difference is within the range of 0.5 to 2.0, that is, the second difference is close to or the same as the first difference. Therefore, change trends of lengths of the at least two bar-shaped flaps 61 are flat, and film thicknesses of the composite film layer 2 in different regions change slowly, so that each of adjacent colors can be relatively fully presented. This can avoid sensory discomfort caused by a sudden color change in adjacent regions when a presentation area of a color is too small, thereby improving an appearance texture of the enclosure 200 and improving user experience.

When the ratio of the second difference to the first difference is within a range of 0.8 to 1.2, the film thicknesses of the composite film layer 2 in the different regions change more slowly, the color of the enclosure 200 changes more slowly, and user experience is better.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An enclosure of a mobile terminal, comprising:
a substrate; and
a composite film layer coated onto the substrate, having a thickness changing along a first direction, a difference in thickness between any two regions arranged along the first direction of the composite film layer being less than or equal to 350 nanometers, the enclosure having a spatially varying color corresponding to a wavelength between 400 nanometers and 760 nanometers;
wherein the thickness of the composite film layer changes along a second direction, wherein the second direction is different from the first direction;
wherein an angle between the second direction and the first direction is less than or equal to 90°; and
wherein the thickness of the composite film layer increases in both the first direction and the second direction, or the thickness of the composite film layer decreases in both the first direction and the second direction.

2. The enclosure according to claim 1, wherein the composite film layer comprises a first film layer and a second film layer arranged in a stack, the first film layer having a first coating material of a first refractive index, and the second film layer having a second coating material of a second refractive index.

3. The enclosure according to claim 2, wherein the first film layer is made of a titanium oxide material, the second film layer is made of a silicon oxide material, and the composite film layer is disposed on an inner surface of the substrate facing towards the mobile terminal.

4. The enclosure according to claim 1, wherein the composite film layer comprises a first region, a second region, and a third region;
wherein the first region, the second region, and the third region have a same size and are sequentially arranged at equal intervals in the first direction;
wherein a difference in average thickness between the first region and the second region has a first value, a difference in average film thickness between the second region and the third region has a second value, and a ratio of the first value to the second value is within a range of 0.5 to 2.0.

5. The enclosure according to claim 1, wherein the spatially varying color comprises: purple, blue, and cyan.

6. The enclosure according to claim 2, wherein the first film layer is made of a silicon nitride material, the second film layer is made of a silicon oxide material, and the composite film layer is located on an outer surface of the substrate facing away from the mobile terminal.

7. A mobile terminal, comprising:
a circuit board having a processor disposed thereon;
a screen;
an enclosure housing the circuit board and the screen, the enclosure comprising:
a substrate; and
a composite film layer coated onto the substrate, having a thickness changing along a first direction, a difference in thickness between any two regions arranged along the first direction of the composite film layer being less than or equal to 350 nanometers, the enclosure having a spatially varying color corresponding to a wavelength between 400 nanometers and 760 nanometers.

8. The mobile terminal according to claim 7, wherein the thickness of the composite film layer changes along a second direction, wherein the second direction is different from the first direction.

9. The mobile terminal according to claim 8, wherein an angle between the second direction and the first direction is less than or equal to 90°; and
wherein the thickness of the composite film layer increases in both the first direction and the second direction, or the thickness of the composite film layer decreases in both the first direction and the second direction.

10. The mobile terminal according to claim 7, wherein the composite film layer comprises a first film layer and a second film layer arranged in a stack, the first film layer having a first coating material of a first refractive index, and the second film layer having a second coating material of a second refractive index.

11. The mobile terminal according to claim 10, wherein the first film layer is made of a titanium oxide material, the second film layer is made of a silicon oxide material, and the composite film layer is disposed on an inner surface of the substrate facing towards the mobile terminal.

12. The mobile terminal according to claim 7, wherein the composite film layer comprises a first region, a second region, and a third region;
wherein the first region, the second region, and the third region have a same size and are sequentially arranged at equal intervals in the first direction;
wherein a difference in average thickness between the first region and the second region has a first value, a difference in average film thickness between the second region and the third region has a second value, and a ratio of the first value to the second value is within a range of 0.5 to 2.0.

13. The mobile terminal according to claim 7, wherein the spatially varying color comprises: purple, blue, and cyan.

14. An enclosure of a mobile terminal, comprising:
a substrate; and
a composite film layer coated onto the substrate, having a thickness changing along a first direction, a difference in thickness between any two regions arranged along the first direction of the composite film layer being less than or equal to 350 nanometers, the enclosure having a spatially varying color corresponding to a wavelength between 400 nanometers and 760 nanometers;
wherein the composite film layer comprises a first film layer and a second film layer arranged in a stack, the first film layer having a first coating material of a first refractive index, and the second film layer having a second coating material of a second refractive index; and
wherein the thickness of the composite film layer increases in the first direction, or the thickness of the composite film layer decreases in the first direction.

15. The enclosure according to claim 14, wherein the thickness of the composite film layer changes along a second direction, wherein the second direction is different from the first direction.

16. The enclosure according to claim 15, wherein an angle between the second direction and the first direction is less than or equal to 90°.

17. The enclosure according to claim 14, wherein the first film layer is made of a titanium oxide material, the second film layer is made of a silicon oxide material, and the composite film layer is disposed on an inner surface of the substrate facing towards the mobile terminal.

18. The enclosure according to claim 14, wherein the first film layer is made of a silicon nitride material, the second film layer is made of a silicon oxide material, and the composite film layer is located on an outer surface of the substrate facing away from the mobile terminal.

19. The enclosure according to claim 14, wherein the composite film layer comprises a first region, a second region, and a third region, the first region, the second region, and the third region are of same size and sequentially arranged at equal intervals in the first direction, a difference in average thickness between the first region and the second region has a first value, a difference in average film thickness between the second region and the third region has a second value, and a ratio of the first value to the second value is within a range of 0.5 to 2.0.

20. The enclosure according to claim 14, wherein the spatially varying color comprises: purple, blue, and cyan.

* * * * *